(12) United States Patent
Fujioka et al.

(10) Patent No.: US 6,366,788 B1
(45) Date of Patent: Apr. 2, 2002

(54) MOBILE TELEPHONE SYSTEM

(75) Inventors: Toru Fujioka, Kokubunji; Isao Yoshida, Nishitama; Mineo Katsueda, Hachioji; Masatoshi Morikawa, Saitama; Yoshikuni Matsunaga, Hachioji; Kenji Sekine, Nishitama; Osamu Kagaya, Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/674,072

(22) PCT Filed: Jul. 8, 1998

(86) PCT No.: PCT/JP98/03068
§ 371 Date: Oct. 26, 2000
§ 102(e) Date: Oct. 26, 2000

(87) PCT Pub. No.: WO00/03490
PCT Pub. Date: Jan. 20, 2000

(51) Int. Cl.[7] .............................. H04B 1/38; H04M 1/00
(52) U.S. Cl. .................. 455/553; 455/188.1; 455/552; 330/51; 333/104; 333/105
(58) Field of Search .......................... 455/78, 82, 83, 455/552, 553, 188.1; 333/104, 105; 330/51; 327/530

(56) References Cited

U.S. PATENT DOCUMENTS 5,256,987 A * 10/1993 Kibayashi et al. .......... 330/295
5,548,246 A * 8/1996 Yamamoto et al. ........... 330/51
5,745,857 A * 4/1998 Maeng et al. ............... 455/553
6,091,966 A * 7/2000 Meadows .................... 455/553
6,163,222 A * 12/2000 Kobayashi .................. 330/302
6,298,244 B1 * 10/2001 Boesch et al. .............. 455/553

FOREIGN PATENT DOCUMENTS

| JP | 60-109310 | 6/1985 |
| JP | 61-121537 | 6/1986 |
| JP | 9-205464 | 8/1997 |

* cited by examiner

*Primary Examiner*—Nay Waung
*Assistant Examiner*—Miguel D. Green
(74) *Attorney, Agent, or Firm*—Mattingly, Stanger & Malur, P.C.

(57) ABSTRACT

In a mobile telephone apparatus corresponding to dual-band provided with an RF power module to operate in two kinds of different frequencies, a common harmonics control circuit is provided to the output circuit of such RF power module to realize higher efficiency in view of controlling respective harmonics power for both band frequencies. Moreover, a means for selectively setting the bias is also provided so that the maximum efficiency can be attained depending on the output power required with respective communication systems with the bias control signal output from the CPU of the control unit interlocking with selection of frequency of the mobile telephone apparatus body.

7 Claims, 8 Drawing Sheets

MOBILE TELEPHONE SYSTEM

TECHNICAL FIELD

The present invention relates to a multi-band system mobile telephone apparatus that can transmit and receive a plurality of band-frequencies and particularly to the technique that can effectively be applied to a mobile telephone apparatus including a transmitting unit for transmitting the radio signal of the dual-band system by amplifying the same signal.

BACKGROUND ART

In the European digital cellular system that is now put into the service as the mobile communication system, it is assumed in the GSM (Global System for Mobile Communication) using the frequency of 0.9 GHz band that subscribers will exceed the system capacity in near future. Therefore, the mobile telephone apparatus (hand-held telephone) corresponding to the dual-band system using, in combination with the GSM system, the DCS (Digital Cellular System) 1800 system using the frequency band near 1.8 GHz is requested because this system is similar to the GSM communication system in such a point that the same modulation system GMSK (Gaussian-filtered Minimum Shift Keying) is introduced.

Here, since above two systems (GSM system and DCS1800 system) are almost used in common except for the frequency, it is possible to constitute the hand-held telephone set that is used in common in the GSM/DSC1800 systems by providing only the high frequency unit such as the power amplifier module that can be used for dual band system.

Therefore, in order to achieve the power amplifier module corresponding to the dual-band system, two power amplifier module systems corresponding to each communication system are integrated within the module and are structured to selectively switch each system as required.

FIG. 8 illustrates a schematic structure of the hand-held telephone discussed prior to the present invention. In the same figure, the reference numeral 6 designates a system control unit (CNTU); 10, a blanching filter; 9, a transmitting/receiving antenna corresponding to the dual-band; 1, a first high frequency power amplifier module (RF power module); 2, a second RF power module; 32, a wide-band amplifier (WAMP); 4, a radio frequency signal processing unit (RFSPU); 7, an operation panel (OP); 8, a transceiver consisting of a speaker (SP) and a microphone (MIC). Moreover, the communication systems that can be used through the switching operation include the GSM system and DSC1800 system.

A radio signal processing circuit 4 is comprised of a modem processing unit, transmitting/receiving IF (intermediate frequency) unit and frequency converting unit (up-/down-converter) or the like and a radio signal (f1 or f2) of any one of the GSM system of 0.9 GHz band or the DSC1800 system of 1.8 GHz band selected is generated and output at the transmitting time. These two kinds of radio transmitting signals f1, f2 are input respectively to the first RF power module 1 and the second RF power module 2.

The RF power module 1 is a power amplifier module corresponding to the GSM communication system and is comprised of an RF power MOSFET (T1) for final stage amplifier, matching circuits MC1 and MC2 consisting of passive elements and inductance element Lc1 for DC choke of drain bias. In this case, the transistor T1 is formed to provide an output, through the switching of a gate voltage to cutoff bias level and predetermined bias level for realizing high efficiency, with the first bias control signal 13 output from the system control unit 6 interlocked with the GSM/DSC1800 selection switch of the hand-held telephone body.

In the same manner, the RF power module 2 is the power amplifier module corresponding to the DSC1800 communication system and is comprised of the RF power MOSFET (T2) for final stage amplifier, matching circuits MC3 and MC4 consisting of passive elements and inductance element Lc2 for DC choke of drain bias. In this case, the transistor T2 is formed to provide an output, through the switching of gate voltage to the cutoff bias level and the predetermined bias level to realize high efficiency, with the second bias control signal 14 output from the system control unit 6 interlocked with the GSM/DSC1800 selection switch of the hand-held telephone body.

The RF power module 1 and RF power module 2 are respectively designed to set the matching with the matching circuits MC1 to MC4 so that the radio signals of the respective communication systems can be amplified effectively.

Thereby, the apparatus is operated as a hand-held telephone set of the GSM system, the bias control signal 13 of the RF power module 1 is set to the predetermined bias level and meanwhile the bias control signal 14 of the RF power module 2 is set to the cutoff bias level. Thereby, it is possible to selectively operate only the RF power module 1 to amplify the GSM radio signal f1 (0.9 GHz band).

When the apparatus is operated as a hand-held telephone set of the DSC1800 system, the bias control signal 14 of the RF power module 2 is set to the predetermined bias level and meanwhile the bias control signal 13 of the RF power module 1 is set to the cutoff bias level and thereby only the RF power module 2 is selectively operated to amplify the DSC1800 radio signal f2 (1.8 GHz band).

The structure explained above is selectively used depending on the setting of communication system by respectively providing the exclusive RF power modules within the apparatus for two communication systems. The RF power modules provided within the apparatus are designed in the optimum manner for respective communication system, assuring economical and effective operation.

Moreover, the RF power module used in the hand-held telephone set satisfies the specifications of the high frequency characteristic determined by each system such as the output power or the like and is also required to satisfy further high efficiency and reduction in size and therefore this RF power module should attain both small size and high efficiency.

Here, the technique to control the harmonics is well known as the technique to realize further high efficiency operation of the power amplifier for transmitter. For example, the Japanese Published Unexamined Patent Application No. SHO 60 (1985)-109310 discloses the structure that one end part of the ¼ wavelength transmission line is terminated at a higher frequency, while the other end thereof is connected to an amplifier element and a series resonant circuit to obtain the desired basic waveform signal output from the serial resonant circuit. With this structure, the connecting point of the output side of the amplifying element and ¼ wavelength transmission line is terminated for the basic waveform and odd number order harmonics and thereby the ideal class F operation mode in which a current and a voltage at the output terminal of the amplifying element become zero can be obtained, and high efficiency can also be attained.

The high frequency power amplifier circuit of the related art forms a power amplifier circuit, as illustrated in FIG. 9(a), by connecting the other end of a ¼ wavelength transmission line 34 with one end thereof is terminated for high frequency signal to the output side of an amplifying element 33 and one end of the series resonance circuit 35 and the other end of the series resonance circuit 35 to an output terminal 36. Here, when the amplifying element 33 operates upon input of a basic signal, the voltages are distributed on the ¼ wavelength transmission line 34. FIG. 9(b) illustrates the condition of voltage distribution on the ¼ wavelength transmission line 34. This voltage distribution can be obtained for signal inputs of basic signal and double-frequency signal. In this figure, I indicates the connection part of the ¼ wavelength transmission line 34 terminated to the output terminal of the amplifying element 33, while II indicates the high frequency termination part of the ¼ wavelength transmission line 34. Sine one end II of the ¼ wavelength transmission line 34 is perfectly terminated for high frequency signal, the voltages are applied to the connection part I to open for the basic frequency signal and to terminate for the double-frequency signal. Moreover, above voltage distribution is similar to the third harmonics or higher and the connection part I is opened for all odd number order harmonics as in the case of the basic frequency signal and is terminated as in the case of the double-frequency signal for all even number order harmonics.

However, when the high efficiency technique is applied to the circuit structure of FIG. 8 explained above, a couple of power amplifier modules adding the circuit for harmonics control as explained above are required, resulting in the disadvantage that the circuit configuration becomes large in size.

A method for selectively using the circuits of the RF power module 1 for only GSM system and the RF power module 2 for only DSC1800 system is superior in the point of efficiency, but when the harmonics control circuits are respectively provided for the modules of both GSM system and DSC1800 system in order to realize still higher efficiency, the circuit configuration becomes large, resulting in increase in size of the hand-held telephone set.

Moreover, it is also proposed as a method for reducing the size of the hand-held telephone set for the dual-band system to use the RF power modules for common use in both GSM system and DSC1800 system and form the driver amplifier and RF power module for both communication systems in the single system structure of one-input and one-output. However, this method has the difficulty that efficiency is lowered to a large extent because the output powers are considerably different in two communication systems.

Namely, when the single system structure of one-input and one-output is formed for both communication systems, since the relationship between the radio frequency signal f1 (0.9 GHz band) of the GSM system and the radio frequency signal f2 of the DSC1800 system (1.8 GHz band) is 2×f1=f2, the circuit that is terminated at the drain terminal of the RF power MOSFET for final stage amplifier for 1.8 GHz corresponding to the double-frequency signal of the GSM system is used to execute the harmonics control to realize high efficiency GSM system by utilizing the ¼ wavelength transmission line of the related art. However, the frequency of 1.8 GHz corresponds to the frequency band of the DSC1800 system and therefore when the DSC1800 system is introduced, the output power cannot be obtained.

Moreover, in view of driving the exclusive RF power module for two communication systems, when sufficient wide frequency band to sufficiently cover the frequency difference between the radio frequency signal f1 (0.9 GHz band) of the GSM system and the radio frequency signal f2 (1.8 GHz band) of the DSC1800 system is given to the driver amplifier, since the unwanted harmonics are also amplified, it is liable that unwanted harmonics are radiated from the antenna via the RF power module and this phenomenon will deteriorate a problem in the communication quality.

The present invention has been proposed to solve such problem and it is therefore an object of the present invention to provide a small-size mobile telephone apparatus that assures higher efficiency for the dual-band communication system using in common two-frequency bands and controls leak of unwanted signals.

DISCLOSURE OF THE INVENTION

In order to achieve the object explained above, the mobile telephone apparatus of the present invention is constituted in such a manner that the bias level of RF power module is selectively switched and harmonics signals are controlled, on the occasion of switching the respective communication systems of the dual-band communication system for transmitting and receiving two band frequencies with a selection switch of the mobile telephone apparatus body, so that the efficiency for the output power of each communication system becomes maximum due to the bias control signal output from the system control part interlocking with this selection switch.

BEST MODE FOR CARRYING OUT THE INVENTION

Next, preferred embodiments of the mobile telephone apparatus of the present invention will be explained in detail below with reference to the accompanying drawings.

Embodiment 1

Figure 1:
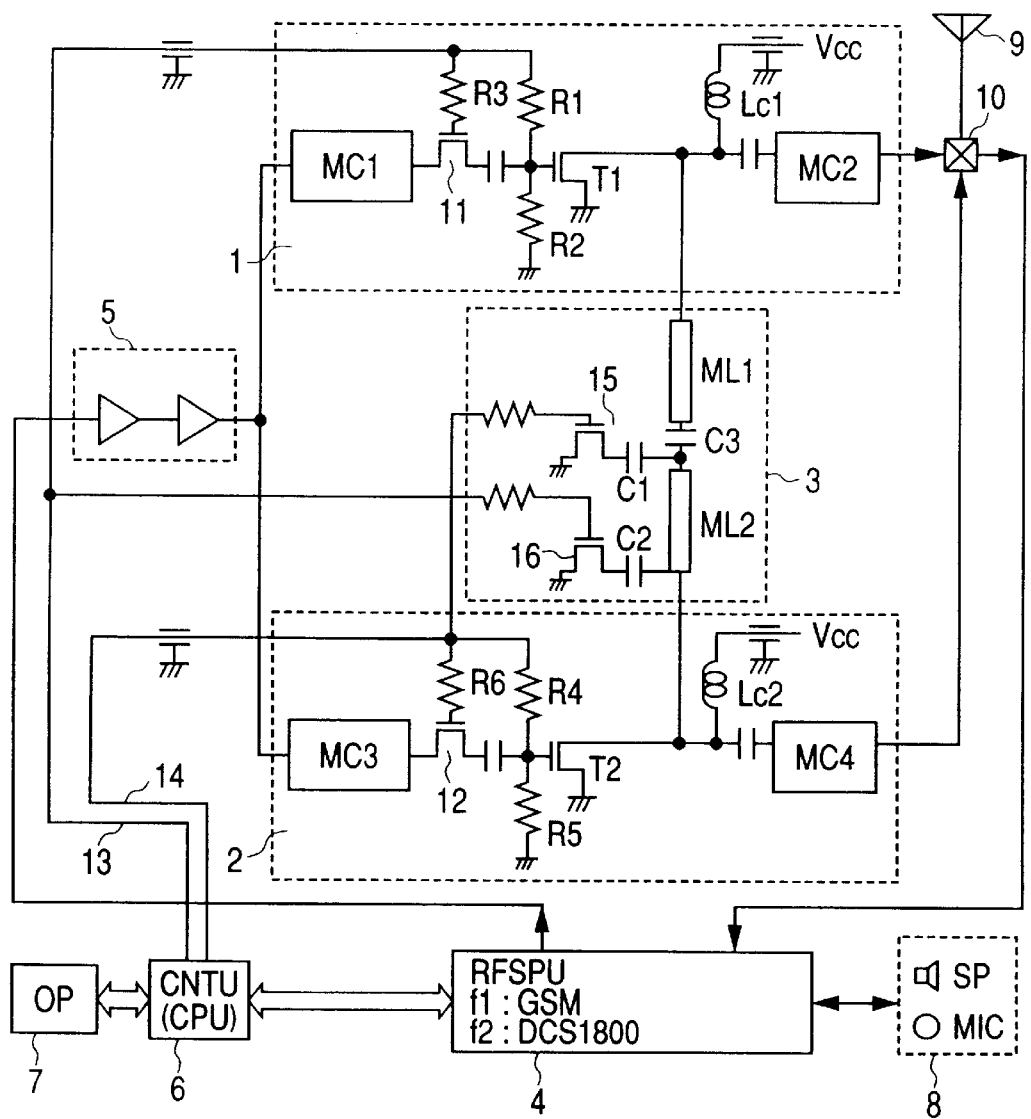
FIG. 1 is a circuit diagram illustrating an embodiment of the mobile telephone apparatus of the present invention.

FIG. 1 is a circuit diagram of a hand-held telephone set for a DSM/DSC1800 dual-band as an embodiment of a mobile telephone apparatus of the present invention. As illustrated in FIG. 1, the hand-held telephone set of this embodiment is comprised of a first RF power module 1, a second RF power module 2, a harmonics control circuit 3, a radio frequency signal processing unit (RFSPU) 4, a drive amplifier (DA) 5 and a system control unit (CNTU) 6 consisting of a central processing unit (CPU), an operation panel (OP) 7, a transceiver 8 consisting of a speaker (SP) and a microphone (MIC) or the like, a transmitting/receiving antenna 9 and a blanching filter 10, etc.

The radio frequency signal-processing unit 4 generates and outputs a radio frequency signal f1 of 0.9 GHz band of the GSM system and a radio frequency signal f2 of 1.8 GHz band of the DSC1800 system depending on the selection of the GSM/DSC1800 communication system. This output is then input to the driver amplifier 5.

Figure 2:
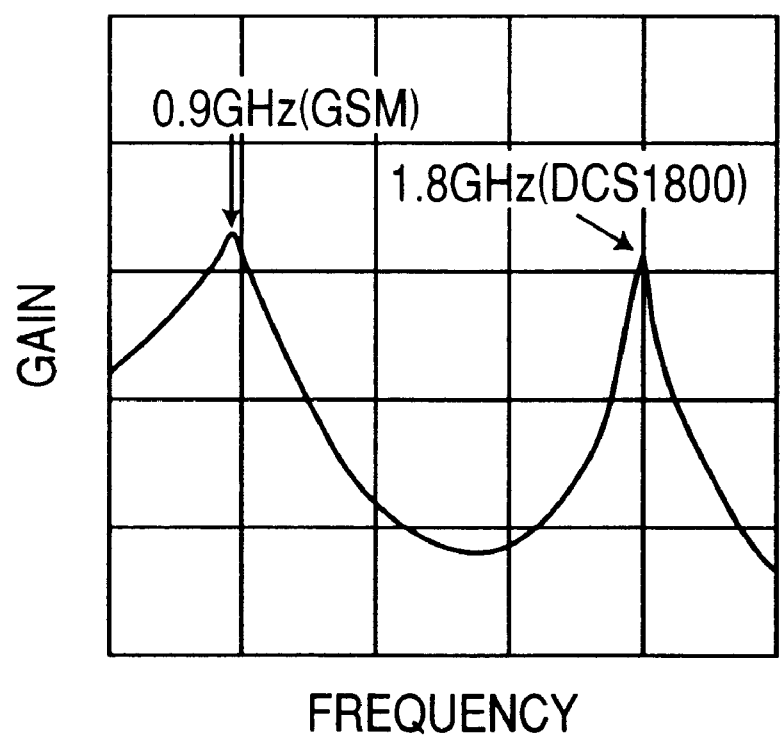
FIG. 2 is a characteristic diagram illustrating the gain characteristic of the driver amplifier used in the circuit of FIG. 1.

The driver amplifier 5 has the structure almost similar to that of the power amplifier of the related art formed of the two stages of Si-MOSFET and is matched with a matching circuit to a couple of frequencies of GSM and DSC1800 , allowing the peak of gain to exist on such frequencies. FIG. 2 illustrates a frequency characteristic of the gain when the drain bias Vcc of the driver amplifier 5 is set to 3.6V and the matching is performed so that the peak of gain exists in the 0.9 GHz band of the GSM system and in the 1.8 GHz band of the DSC1800 system. This matching can be realized, for example, by combining an inductance element and s capacitance element and also setting the values of these elements to the adequate values to obtain high gain. After the signals of two kinds of frequencies are amplified up to the high gain, these signals are then input to the RF power modules 1 and 2.

Figure 8:
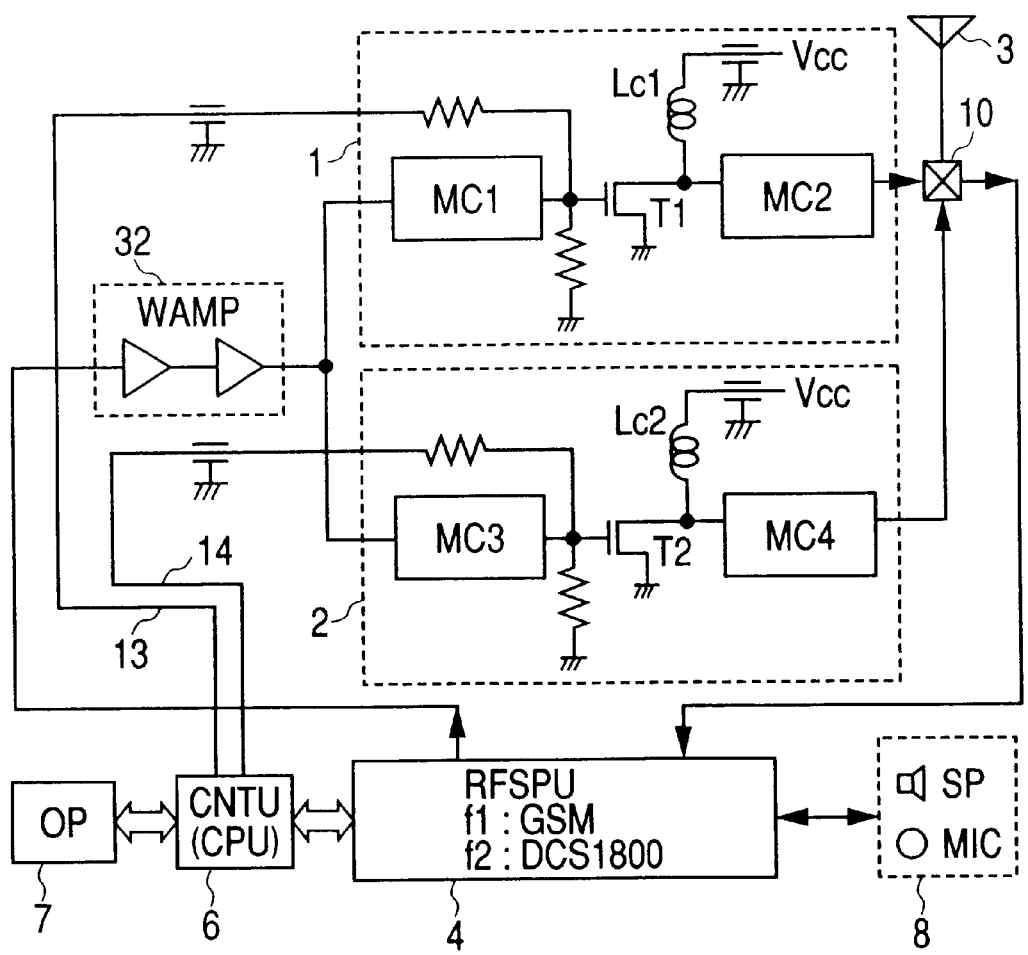
FIG. 8 is a circuit diagram illustrating a structural example of the mobile telephone apparatus discussed prior to the present invention.
Figure 9:
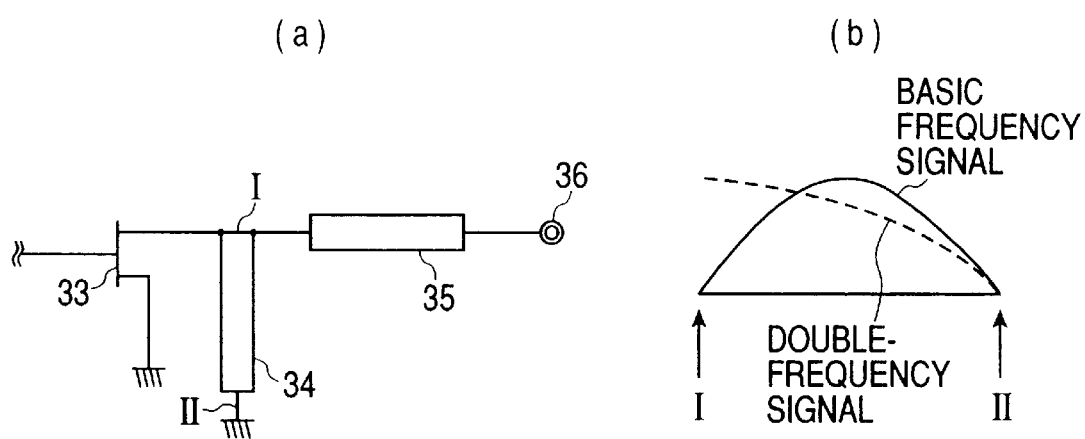
FIG. 9 is a circuit structure illustrating an example of the power amplifier module of the related art.

Owing to this characteristic, since the drive amplifier 5 explained above has the band-pass filter characteristic, in comparison with the apparatus illustrated in FIG. 8 using a wide-band amplifier having the wide band frequency characteristic in order to cover both frequency bands (f1 to f2) of the GSM/DSC1800 systems within the amplifier band, the radio frequency signal input to the high frequency power output transistor can be amplified under the condition that leak of harmonics resulting in the deterioration of communication quality is prevented.

As illustrated in FIG. 1, the RF power module 1 is comprised of a first RF power MOSFET (T1) as an amplifying element, resistance elements R1 to R3 for bias, a first switching FET 11 as a switch provided in the input side to turn ON and OFF the route, and matching circuits MC1, MC2 respectively consisting of inductance L and capacitance C.

The first MOSFET (T1) can switch the predetermined level to realize high efficiency amplification of the radio frequency signal in the GSM communication system to the cut-off bias level condition with the first bias control signal 13 given to the gate via the resistance element R1 from the system control part 6. Moreover, the switching FET 11 controls the radio frequency signal to ON and OFF by giving the bias control signal 13 to the gate via the high resistance R3. Here, the matching circuits MC1, MC2 are designed in the optimum condition to amplify with higher efficiency the GSM radio frequency signal f1.

In the same manner, the RF power module 2 is comprised of a second RF power MOSFET (T2) as the amplifying element, resistance elements R4 to R6 for bias, a second switching FET 12 provided in the input side to switch ON and OFF the route, and matching circuits MC3, MC4 consisting of passive elements of inductance L and capacitance C.

The second MOSFET (T2) can switch the predetermined bias level which realizes high efficiency amplification of radio frequency signal to the cut-off bias level in the DSC1800 system by the second bias control signal 14 given to the gate via the resistance element R4 from the system control part 6. The radio frequency signal can be switched to ON and OFF by giving the bias control signal 14 to the gate of switching FET 12 via the high resistance R6. The matching circuits MC3, MC4 are designed in the optimum condition to amplify with higher efficiency the radio frequency signal f2 of the DSC1800 system.

Moreover, a harmonics control circuit 3 is connected at the drain ends of the first MOSFET (T1) and second MOSFET (T2).

The harmonics control circuit 3 is comprised of two transmission lines in the length corresponding to ⅛ wavelength (λ⅛) of the GSM radio frequency signal f1, DC rejection capacitors C1, C2, C3 having sufficiently lower impedance for the RF band, and switching FETs 15, 16 for controlling first and second harmonics control to be controlled for ON and OFF with the bias control signals 13, 14 or the like. To the other end of the transmission line ML1 with one end thereof connected to the drain of the transistor T1, one end of the transmission line ML2 is connected via the capacitor C3. Moreover, the switching FET 15 for first harmonics control is connected to one end of the transmission line ML2 via the capacitor C1 and the switching FET 16 for second harmonics control is connected to such other end of the transmission line ML2 via the capacitor C2.

When the hand-held telephone set of this embodiment structured as explained above is used in the GSM communication system, the bias control signal 13 is set to high level and the bias control signal 14 to the cut-off bias level. Thereby, only the RF power module 1 can be set to the bias level for high efficiency operation and simultaneously the harmonics control can also be performed. In this case, since the RF power module 2 becomes non-conductive because the switching FET 12 is turned OFF, input of the signal to transistor T2 is cut off and the transistor T2 is set to the cut-off bias level and becomes non-conductive. Accordingly, only the GSM radio frequency signal f1 is amplified.

When the hand-held telephone set of this embodiment is used in the DSC1800 system, the bias control signal 14 is set to high level, while the bias control signal 13 to the cut-off bias level. Thereby, only the RF power module 2 can be set to the bias level for high efficiency operation and harmonics control can also be performed simultaneously. In this case, when the RF power module 1 becomes non-conductive since the switching FET 11 is turned OFF, thereby input of the signal to the transistor T1 is cut off and the transistor T1 becomes non-conductive because it is set to the cut-off bias level. Therefore, only the radio frequency signal f2 of DSC1800 system can be amplified.

Figure 3:
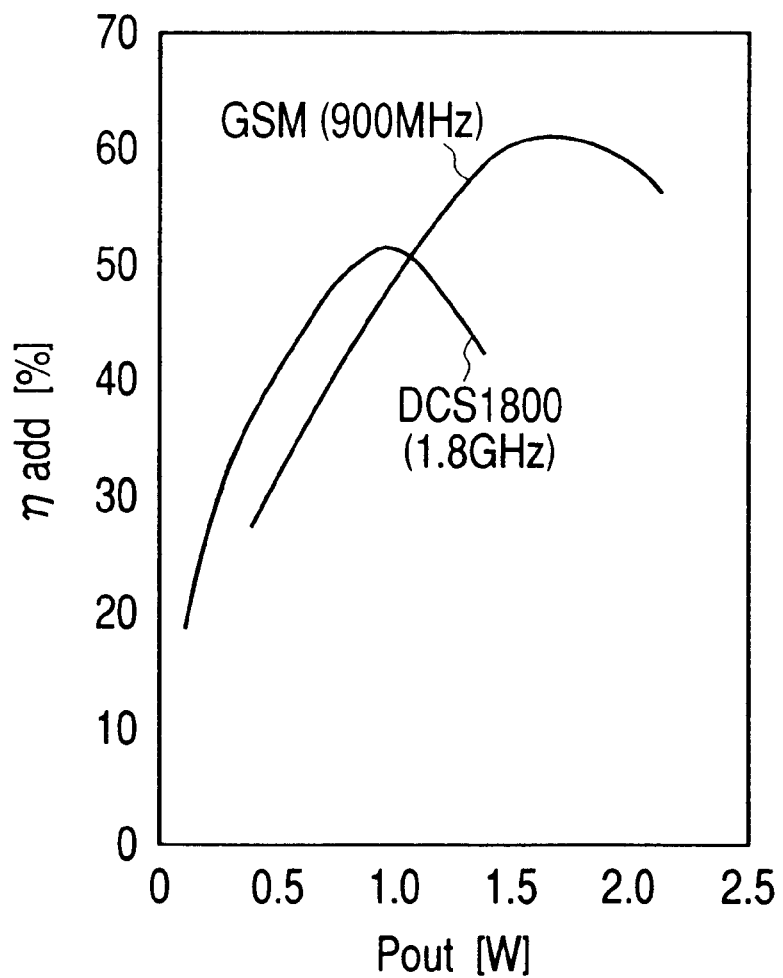
FIG. 3 is a characteristic diagram illustrating the efficiency of the silicon (Si) -MOSFET in the output stage used in the circuit of FIG. 1.

FIG. 3 is a diagram illustrating the additional efficiency η add characteristic for the output power Pout in regard to the Si-MOSFET of the chip in the final stage used in the RF modules 1, 2. This figure illustrates the characteristics of both Si-MOSFET having large gate width corresponding to the GSM communication system and the Si-MOSFET having small gate width corresponding to the DSC1800 communication system.

From this figure, it can be understood that there is a point where the additional efficiency η add becomes the maximum at the output power Pout required in each communication system by using a large or small gate width, as required, depending on respective communication systems.

Figure 4:
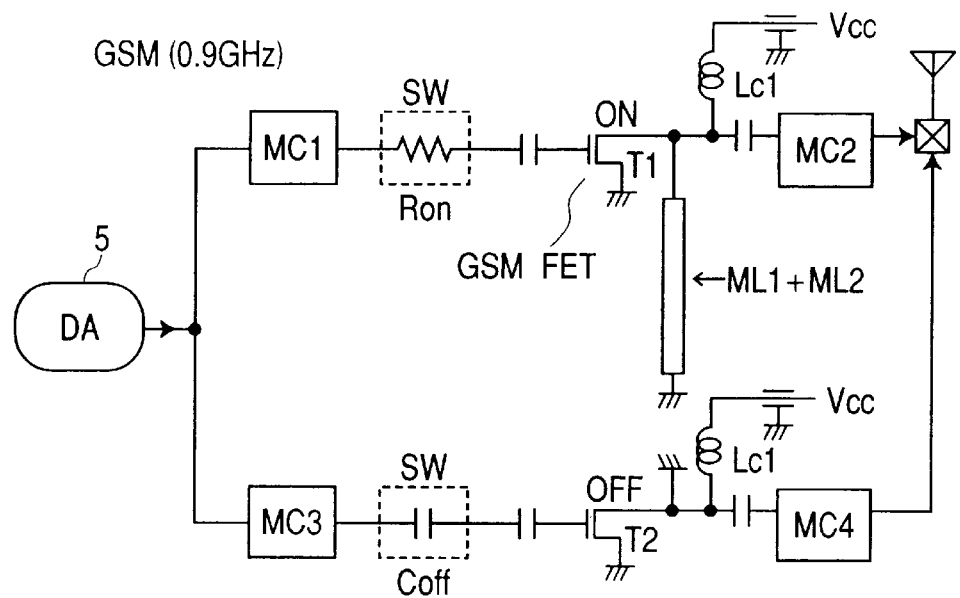
FIG. 4 is a circuit diagram of essential part during operation of the GSM system of the apparatus illustrated in FIG. 1.
Figure 5:
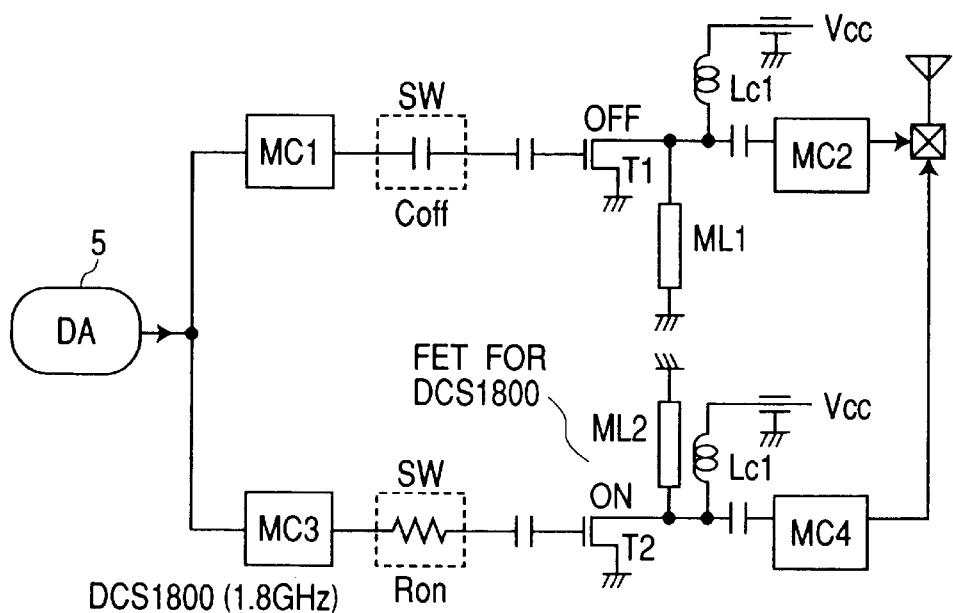
FIG. 5 is a circuit diagram of essential part during operation of the DSC1800 system of the apparatus illustrated in FIG. 1.

FIG. 4 and FIG. 5 illustrate the circuit diagram of essential parts during the operation indicating the operation of the transmission lines ML1 and ML2 of the harmonics control circuit 3 in the case where the hand-held telephone set of this embodiment is used in the GSM communication system and the DSC1800 communication system. In these figures, $R_{on}$ and $C_{off}$ indicate the equivalent ON resistance and OFF resistance when the first and second switching FETs 11, 12 are turned ON and OFF.

When the hand-held telephone set is used in the GSM communication system, since only the RF module 1 is operated as illustrated in FIG. 4, the FET having the gate width suitable for GSM system can be selected. Since the switching FET 15 for harmonics control is turned OFF and the switching FET 16 for harmonics control is turned ON with the bias control signals 13, 14, the drain of the transistor T1 is terminated for the radio frequency via the series connected transmission lines ML1 and ML2. The total length of the transmission lines ML1 and ML2 corresponds to the ¼ wavelength in the GSM radio signal frequency f1 and therefore the drain end of the transistor T1 is set for termination for the even number order harmonics of the GSM radio signal frequency f1 and for opening for the odd number order harmonics. High efficiency can be realized through such harmonics control.

Moreover, in addition to the setting of the transistor T2 to the cut-off bias level with the bias control signal 14 so that the unwanted harmonics signal is no longer input to the RF module, the second switching FET 12 is turned to non-conductive condition to cut-off the signal input.

When the hand-held telephone set of this embodiment is used in the DSC1800 communication system, the FET having the gate width suitable for the DSC1800 system can be selected because only the RF module 2 is operated as illustrated in FIG. 5. Since the switching FET 15 for harmonics control is turned ON and the switching FET 16 for harmonics control is turned OFF with the bias control signals 13, 14, the drains of the transistors T1, T2 are grounded for the higher frequency via the respective transmission lines ML1 and ML2. The respective length of the transmission lines ML1 and ML2 corresponds to ¼ wavelength in the DSC1800 radio frequency signal f2 and therefore the drain end of the transistor T2 is terminated for the even number order harmonics of the DSC1800 radio frequency signal f2 and opened for the odd number order harmonics. With such harmonics control explained above, the higher efficiency can be attained.

Moreover, in addition to the setting of the transistor T1 to the cut-off bias level with the bias control signal 13 so that the unwanted harmonics signal is no longer input to the RF module 1, the first switching FET 11 is turned OFF and becomes non-conductive and thereby signal input is cut off.

In addition, as explained above, the driver amplifier 5 is designed not to require the wide frequency band even in any case of the DSC1800 communication system and GSM communication system and has the gain only in both frequency bands of the GSM radio frequency signal f1 and the DSC1800 radio frequency signal f2. Accordingly, the unwanted harmonics signal is not easily input to the RF power modules 1, 2.

Embodiment 2

Figure 6:
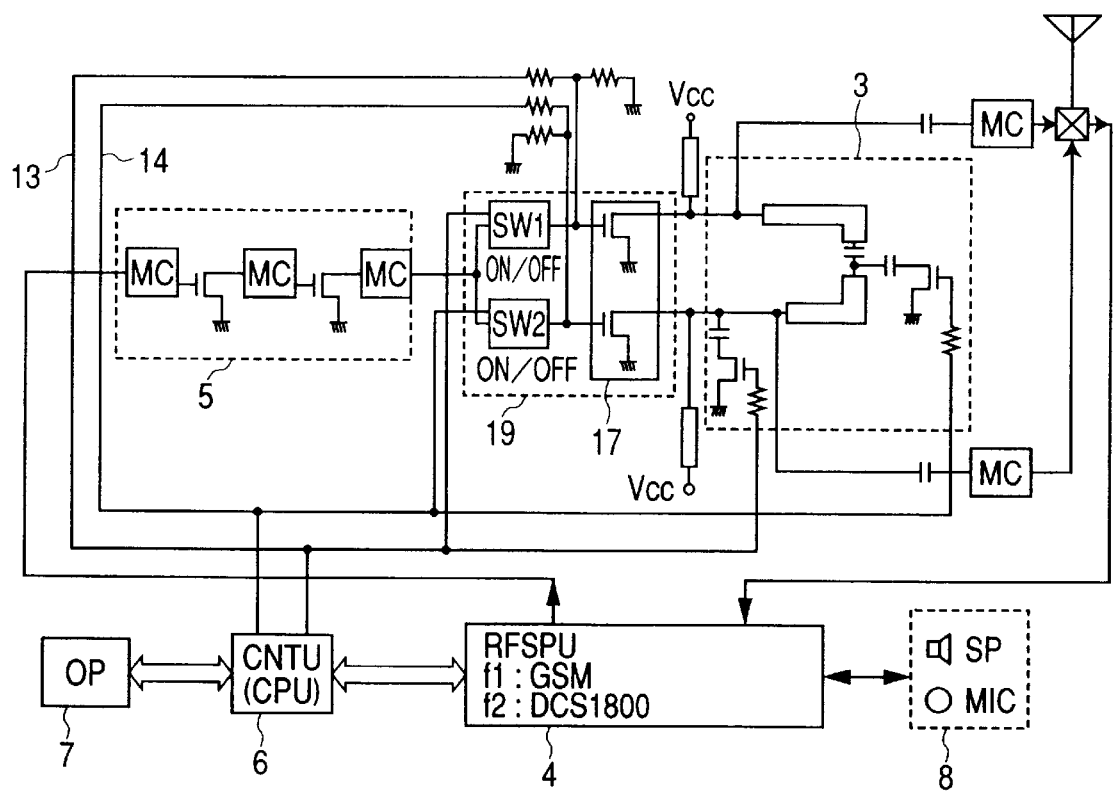
FIG. 6 is a circuit diagram of essential part illustrating another embodiment of the mobile telephone apparatus of the present invention.

FIG. 6 is a circuit diagram of the hand-held telephone set of the other embodiment of the mobile telephone apparatus of the present invention. The telephone set is the hand-held telephone set for dual-frequency bands comprising the single module of RF power module 1 corresponding to the two communication systems of the GSM system and DSC1800 system. In FIG. 6, the like structural elements similar to those in the hand-held telephone set of the embodiment illustrated in FIG. 1 is designated with the like reference numerals. In this FIG. 6, the reference numeral 17 designates a Si-MOSFET chip; 19, an RF power module amplifier unit that is designed in one module for reduction in size.

The hand-held telephone set of this embodiment is structured to change the Si-MOSFET to be operated with the bias control signals 13, 14 output from the system control unit (CNTU) 6 for the GSM communication system providing a large output power and the DSC1800 communication system providing a small output power. With the structure explained above, the size of hand-held telephone set can be reduced because the single RF power module for single system can be used without providing two RF power modules respectively corresponding to respective communication systems.

Figure 7:
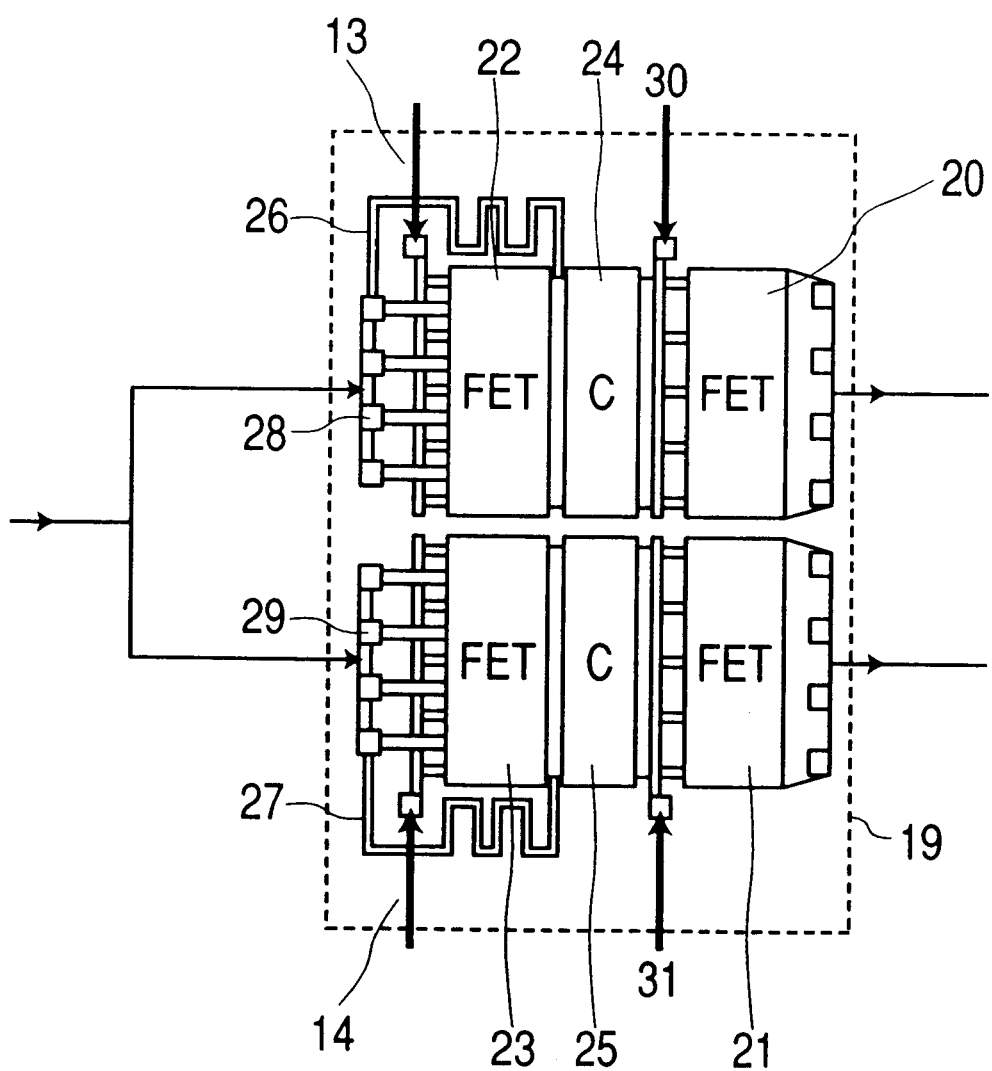
FIG. 7 is a diagram illustrating the layout on a chip of the RF power amplifier module of the apparatus illustrated in FIG. 6.

For example, in view of selectively using the Si-MOSFETs in different gate widths depending on the communication system, the RF power module amplifier unit 19 of FIG. 6 is given the structure, as illustrated in FIG. 7, that a couple of systems including the high frequency power output transistors for power amplification are arranged on the same chip.

In FIG. 7, the reference numeral 20 designates a first unit Si-MOSFET as a part of the divided high frequency power output transistor to amplify the power of radio frequency signal; 21, a second unit Si-MOSFET; 22, an FET (SW1) for a first switching operation formed on the same chip to make the ON/OFF switching operation interlocking with the selection of the communication system; 23, an FET (SW2) for a second switching operation formed on the same chip to make the ON/OFF switching operation interlocking with the selection of the communication system; 24, 25, first and second DC rejection capacitors; 26, 27, meander line inductors mainly for improving isolation of switching operation FETs 22 and 23; 28, 29, first and second connection input pads for inputting the radio frequency signal amplified with the driver amplifier 5; 13, a first bias control signal given from the system control unit 6 to turn ON and OFF the switching operation FET 22; 14, a second bias control signal given from the system control unit 6 to turn ON and OFF the switching operation FET 23.

Moreover, the reference numeral 30 designates a first gate bias control signal for selectively setting the gate voltage that is divided from the voltage of the first bias control signal 13 with a resistor and applied to the first unit Si-MOSFET 20 to become any one of the highly efficient predetermined bias level or the cut-off level, and 31 designates a second gate bias control signal for selectively setting the gate voltage that is divided from the voltage of the second bias control signal 14 with a resistor and applied to the second unit Si-MOSFET 21 to become any one of the highly efficient predetermined bias level or cut-off level.

The elements explained above are all formed on the same chip for reduction in size and the input and output thereof are connected via the pads.

With the structure explained above, when the hand-held telephone set of this embodiment is used for the GSM system, the switching operation FET 22 is turned ON with the first bias control signal 13, the gate bias control signal 30 is set to the predetermined bias level and moreover the switching operation FET 23 is turned OFF with the second bias control signal, and the gate bias signal 31 is set to the cut-off level to selectively operate only the firs unit Si-MOSFET to amplify the power of the GSM radio frequency signal f1.

Moreover, when the hand-held telephone set of this embodiment is used for the DSC1800 system, the switching operation FET 23 is turned ON with the second bias control signal 14 and the gate bias control signal 31 is set to the predetermined bias level, while the switching operation FET 22 is turned OFF with the first bias control signal 13 and the gate bias control signal 30 is set to the cut-off bias level to selectively operate only the second unit Si-MOSFET to amplify the power of the DSC1800 system radio frequency signal f2.

As explained above, in this embodiment, a chip of smaller gate width is used for in DSC1800 system for the selection between the GSM system and DSC1800 system. Therefore, a drain current is kept in the low level and consumption of the DC element can be controlled. Accordingly, in this embodiment, high efficient amplification can be realized even for the low output power.

Like the embodiment explained above, the drain end of the first unit Si-MOSFET 20 is controlled to terminate the even number order harmonics or open the odd number order harmonics with the harmonics control circuit 3 in the GSM radio frequency signal amplifying operation, while the drain end of the second unit Si-MOSFET 21 is controlled to terminate the even number order harmonics or open to odd number order harmonics in the DSC1800 radio frequency signal amplifying operation.

As explained above, the mobile telephone apparatus of the present invention can provide an excellent effect that high efficiency and reduction in size can be realized simultaneously, even for both GSM/DSC1800 systems, by utilizing the bias control signal output from the system control unit depending on the frequency selection switch of the mobile telephone apparatus.

Moreover, it is also possible to use a passive element that can process the RF signal such as the GaAs-MESET and bipolar transistor, in place of the Si-MOSFET used in the driver amplifier and RF power module.

The preferred embodiments of the hand-held telephone apparatus of the present invention have been explained above but the present invention is not limited thereto and can be changed or modified in various manners within the scope of the spirit of the present invention. For example, in the above embodiments, GMSK is used as the modulation system but various kinds of digital modulation systems such as π/4 shift QPSK (Quadrature Phase Shift Keying) modulation system, QPSK modulation system and offset QPSK modulation system and analog modulation systems such as FM modulation system, AM modulation system or the like can also be applied and there is no any limitation on the signal frequencies.

INDUSTRIAL APPLICABILITY

The present invention provides, in the mobile telephone apparatus of dual-band system which is capable of transmitting and receiving a couple band frequencies for the two kinds of communication systems, the effect of obtaining the small size and highly efficient mobile telephone apparatus that can prevent leak of unwanted harmonics by introducing the structure that the RF power module used in the mobile telephone apparatus is controlled with the control means interlocking with the communication system selection switch of the mobile telephone apparatus body.

What is claimed is:

1. A dual-band type mobile telephone apparatus that can transmit and receive the band frequencies of the first and second radio frequency signals in different frequencies, comprising:

a frequency selection switch provided on said apparatus body to select said first and second radio frequency signals;

a driver amplifier having the frequency characteristic tuned with both frequency bands of said first and second radio frequency signals;

a first RF power module for amplifying, with a first power transistor, the power of the first radio frequency signal amplified with said driver amplifier and then outputting the amplified signal to an antenna;

a second RF power module for amplifying, with a second power transistor, the power of the second radio frequency signal amplified with said driver amplifier and then outputting the amplified signal to an antenna;

a control unit interlocked with said frequency selection switch to output first and second bias control signals for selectively switching the operating condition of said first and second power transistors;

first and second switching elements respectively connected in series in the input side of said first and second power transistors to be selected to conductive/non-conductive conditions interlocking with said first and second bias control signals; and a harmonics control circuit used in common for said first and second radio frequency signals that is set so that the drain ends of said first and second power transistors terminate, interlocking with said first and second bias control signal, for the even number order harmonics of said first and second radio frequency signals or opens for the odd number order harmonics of the radio frequency signals.

2. A mobile telephone apparatus according to claim 1, wherein said first and second power transistors are comprised of a plurality of parallel connected unit MOSFETs and the first power transistor and second power transistor have different gate width.

3. A mobile telephone apparatus according to claim 2, wherein said first and second power transistors and said first and second switching elements are provided within one RF power module in place of using said first and second RF power modules.

4. A mobile telephone apparatus according to claim 3, wherein said RF power module is formed on the same semiconductor substrate.

5. A mobile telephone apparatus according to claim 1, wherein said harmonics control circuit is comprised of:

first and second transmission lines in the length corresponding to ⅛ wavelength of a first radio frequency signal provided between the drain end of said first power transistor and the drain end of said second power transistor;

a first DC rejection capacitor connected between said first and second transmission lines;

a first switching element that is inserted via a second DC rejection capacitor between a ground and a one end of the second transmission line connected to the drain end side of said second power transistor to become conductive for the first radio frequency signal; and second switching element that is inserted via the third DC rejection capacitor between the ground and the other end of said second transmission line to become conductive for the second radio frequency signal.

6. A mobile telephone apparatus according to claim 1, wherein the frequency of said first radio frequency signal is equal to ½ the frequency of said second radio frequency signal.

7. A mobile telephone apparatus according to claim 1, wherein said first and second switching elements are formed of FET switches.

* * * * *